United States Patent
Masuda et al.

(10) Patent No.: US 6,768,387 B1
(45) Date of Patent: Jul. 27, 2004

(54) VOLTAGE CONTROLLED OSCILLATOR AND PLL CIRCUIT USING THE SAME

(75) Inventors: Noboru Masuda, Tokorozawa (JP); Hiroki Yamashita, Hachioji (JP)

(73) Assignee: Renesas Technology Corporation, Tokyo (JP)

( * ) Notice: Subject to any disclaimer, the term of this patent is extended or adjusted under 35 U.S.C. 154(b) by 181 days.

(21) Appl. No.: 09/634,544

(22) Filed: Aug. 8, 2000

(30) Foreign Application Priority Data

Mar. 8, 2000 (JP) ........................................ 2000-068606

(51) Int. Cl.⁷ .................................................. H03B 1/00
(52) U.S. Cl. ...................... 331/57; 331/179; 331/36 C; 331/34; 331/11
(58) Field of Search ........................ 331/57, 179, 36 C, 331/34, 11

(56) References Cited

U.S. PATENT DOCUMENTS 5,304,955 A * 4/1994 Atriss et al. ................. 331/1 R
5,485,126 A * 1/1996 Gersbach et al. ............. 331/57

FOREIGN PATENT DOCUMENTS

JP 9-74352 3/1997
JP 11-15541 1/1999

OTHER PUBLICATIONS

V. von Kaenel et al., "A 600MHz CMOS PLL Microprocessor Clock Generator with a 1.2GHz VCO", *1998 IEEE International Solid–State Circuits Conference Digest of Technical Papers*, Apr. 1998, pp. 396–397, ISBN 0–7803–4344–1 (paper presented on Feb. 7, 1998).

* cited by examiner

Primary Examiner—Arnold Kinkead

(57) ABSTRACT

The present invention relates to a PLL circuit and a voltage controlled oscillator wherein a clock signal jitter caused when the supply voltage fluctuates of which is small can be supplied, and the voltage controlled oscillator is provided with a MOS transistor to one end of which a first power source (Vss) is connected and to the gate electrode of which a control signal for controlling the oscillation frequency is input, an oscillator connected between the other end of the MOS transistor and a second power source (Vdd) and a capacitive element connected to the oscillator in parallel and is further provided with additive control means for minutely controlling the oscillation frequency.

16 Claims, 10 Drawing Sheets

VOLTAGE CONTROLLED OSCILLATOR AND PLL CIRCUIT USING THE SAME

BACKGROUND OF THE INVENTION

1. Field of the Invention

The present invention relates to a phase-locked loop (PLL) circuit for generating a clock signal used inside a semiconductor integrated circuit chip and a voltage controlled oscillator which is one of components of the PLL circuit, particularly relates to a circuit for reducing jitter caused by supply voltage fluctuation.

2. Description of the Related Art

FIG. 2 shows an example of a conventional type voltage controlled oscillator. The circuit is described on a 397th page of manuscripts of International Solid-state Circuit Conference (ISSCC) held on Feb. 7, 1998. The circuit includes three-stage inverters between a node shown by VCCO and a power source shown by VSSA and the oscillation frequency of the oscillator is controlled by controlling the gate voltage of a MOS transistor shown by M2. In the circuit, a capacitor shown by C is also provided so that the oscillation frequency of the oscillator is not immediately varied even if supply voltage between power supply VDDA supplied from outside and VSSA fluctuates and the fluctuation of voltage between the node VCCO and the power source VSSA is retarded. Hereby, jitter caused by supply voltage fluctuation is reduced.

FIG. 3 shows another example of the conventional type voltage controlled oscillator. The circuit is disclosed in Japanese published unexamined patent application No. Hei 11-15541 and is configured by composing circuits shown in FIGS. 3 and 6 of the patent application. The circuit controls its oscillation frequency by rough adjustment by an analog control signal shown by a reference number 150 and fine adjustment by a digital control signal shown by a reference number 151. In the circuit, a capacitor 120 is also provided so that the oscillation frequency is not immediately varied even if supply voltage between power supply Vdd supplied from outside and Vss fluctuates and the fluctuation of voltage between a node 350 and power supply Vdd is retarded. Hereby, jitter caused by supply voltage fluctuation is reduced.

SUMMARY OF THE INVENTION

In the circuit shown in FIG. 2, when the capacitance of the capacitor shown by C is greatly increased, the stability of control is not kept as described on a 396th page of the document described above. Therefore, it is difficult to extremely increase the capacitance to extremely reduce jitter.

In the circuit shown in FIG. 3, as MOS transistors 321 to 325 and 331 to 335 for controlling the oscillation frequency and a MOS transistor 340 for stabilizing supply voltage fluctuation are separately provided, five MOS transistors (for example, 331, 311, 301, 321, 340) are connected in series between power supply Vdd and Vss. Therefore, voltage applied to each transistor is reduced. However, when voltage applied to the MOS transistor 340 is reduced, a range in which the MOS transistor is operated in a saturation state (a state in which current is hardly varied even if voltage between the drain and the source fluctuates) is narrowed and therefore, the width of fluctuation in which supply voltage fluctuation is allowable is narrowed. When voltage applied to the MOS transistor 340 is increased to secure the allowable range of supply voltage fluctuation, voltage (that is, voltage applied to the oscillator) between a node 350 and the power supply Vdd is reduced and the upper limit oscillation frequency is reduced.

One of objects to be achieved by the invention is to reduce jitter caused when the supply voltage fluctuates in the oscillation output of a voltage controlled oscillator.

Another object to be achieved by the invention is to reduce jitter caused when the supply voltage fluctuates in the oscillation output of a PLL circuit.

The other object to be achieved by the invention is to reduce jitter caused when the supply voltage fluctuates in a clock signal of a semiconductor integrated circuit.

One of the problems of the invention can be solved by providing second means for controlling the oscillation frequency of an oscillator separately from a MOS transistor in a voltage controlled oscillator provided with the MOS transistor one end of which is connected to a first power source, the oscillator and a capacitative element connected in parallel between the other end of the MOS transistor and a second power source and configured so that the oscillation frequency of the oscillator is controlled by controlling the gate voltage of the MOS transistor.

Also, another problem of the invention can be solved by composing a PLL circuit using the voltage controlled oscillator described above.

Also, the other problem of the invention can be solved by configuring a semiconductor integrated circuit using the PLL circuit described above.

DESCRIPTION OF THE PREFERRED EMBODIMENTS

Figure 1:
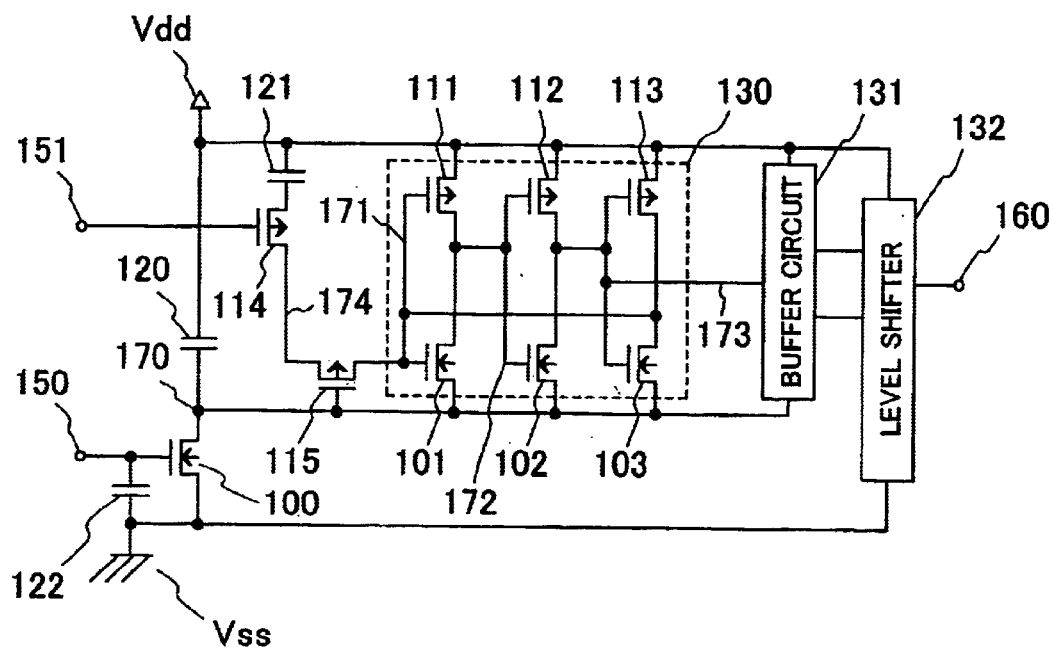
FIG. 1 is a circuit diagram showing one of embodiments of a voltage controlled oscillator according to the invention.

FIG. 1 shows one of embodiments of a voltage controlled oscillator according to the invention. As shown in FIG. 1, reference numbers 100 to 103 denote an N-channel MOS (hereinafter called NMOS) transistor, 111 to 115 denote a P-channel MOS (hereinafter called PMOS) transistor, 120 to 122 denote a capacitative element, 131 denotes a buffer circuit and 132 denotes a level shifter. Also, Vdd denotes a power source on the side of high potential and its terminal, Vss denotes a power source on the side of low potential and its terminal, a reference number 150 denotes an analog control signal and its input terminal, 151 denotes a digital control signal and its input terminal, 160 denotes oscillation output and its output terminal and 170 to 174 denote an internal signal conductor and its node.

The capacitative elements 120 to 122 can be realized in relative small area if they are configured using capacity between a PMOS or an NMOS source electrode or drain electrode and a gate electrode. Also, for the back bias of an NMOS transistor composing the buffer circuit 131 and the NMOS transistors 101 to 103, voltage at the node 170 is applied.

A part including the NMOS transistors 101 to 103 and the PMOS transistors 111 to 113, that is, a part shown by a reference number 130 functions as an oscillator. In the oscillator, the NMOS transistor 101 and the PMOS transistor 111, the NMOS transistor 102 and the PMOS transistor 112 and the NMOS transistor 103 and the PMOS transistor 113 respectively compose an inverter, and the oscillator is a so-called ring oscillator in which the output and the input of the three inverters are sequentially connected.

The oscillation frequency of the oscillator is controlled by rough adjustment by an analog control signal 150 and fine adjustment by a digital control signal 151.

The rough adjustment by an analog control signal 150 is executed by controlling current which flows in the NMOS transistor 100. For example, when the voltage of a control signal 150 is increased, current which flows in the NMOS transistor 100 increases, voltage at the node 170 is reduced and voltage between the power source Vdd and the node 170, that is, voltage applied to the oscillator 130 is increased. Then, the oscillation frequency of the oscillator is increased. When the voltage of a control signal 150 is reduced, the oscillation frequency of the oscillator is reduced by action reverse to the above-mentioned action.

The NMOS transistor 100 is required to cause much current to flow so as to enable both current which flows in the oscillator 130 and current which flows in the buffer circuit 131 to flow. Also, as described later, it is desirable that the NMOS transistor 100 is in a saturation state (in a state in which current that flows in the MOS transistor hardly varies for the fluctuation of voltage between the drain electrode and the source electrode). Then, the NMOS transistor 100 is configured so that multiple NMOS transistors are connected to the NMOS transistor 100 in parallel and the total gate width is by far larger (for example, 100 times or more) than the gate width of the NMOS transistors 101 to 103 and others.

The fine adjustment by a digital control signal 151 is performed by controlling the dimension of a load applied to the node 171 which is an internal signal conductor of the oscillator. As the PMOS transistor 115 always conducts, the nodes 171 and 174 are always connected. Therefore, as the PMOS transistor 114 conducts in case a control signal 151 is at a low level for example, the capacitative element 121 is connected to the nodes 171 and 174.

Then, a load applied to the node 171 increases by the quantity of the capacitative element 121. In case a control signal 151 is at a high level, the PMOS transistor 114 is cut off and a load applied to the node 171 decreases by the quantity of the capacitative element 121. Therefore, when a control signal 151 is at a low level, the oscillation frequency becomes low and when it is at a high level, the oscillation frequency becomes high.

The variation of the oscillation frequency by a control signal 151 is varied by the capacitance of the capacitative element 121. The circuit is similarly operated even if the PMOS transistor 115 is not provided, however, in this embodiment, the PMOS transistor 115 is provided to reduce an effect which coupling noise induced on the node 174 when a control signal 151 changes has upon the node 171.

Next, the operation when supply voltage between Vdd and Vss changes will be described. However, the capacitance of the capacitative element 120 shall be large enough. The gate width (the total gate width in case plural NMOS transistors are provided) of the NMOS transistor 100 shall be large enough and shall be in a saturation state.

As the capacitance of the capacitative element 120 is large immediately after the supply voltage changes, voltage applied to the oscillator 130 hardly varies. Therefore, voltage applied to the NMOS transistor 100 varies by quantity substantially equal to the variation of supply voltage, however, if voltage after variation is in a range in which the NMOS transistor 100 is in a saturation state, current which flows in the NMOS transistor 100 hardly varies independent of the variation of supply voltage. Most of a little variation of current is supplemented by the charge or the discharge of the capacitative element 120, and the variation of current which flows in the oscillator 130 and current which flows in the buffer circuit 131 is further small. Therefore, even if the supply voltage suddenly changes, the oscillation frequency immediately after the change hardly varies if only the change is in a range in which the NMOS transistor 100 is in a saturation state.

Next, the operation after a little time elapses since the supply voltage changes will be described. If voltage applied to the NMOS transistor 100 changes even if the NMOS transistor 100 is in a saturation state, current which flows in the NMOS transistor 100 slightly varies. Most of the variation is supplemented by the charge or the discharge of the capacitative element 120, however, voltage applied to the capacitative element 120 at that time slightly varies. Voltage applied to the capacitative element 120 is exactly voltage applied to the oscillator 130 and the oscillation frequency slightly varies depending upon the variation.

However, in case the voltage controlled oscillator is used for a PLL circuit and others, the variation of the oscillation frequency is detected before the variation is increased. Then, the result is immediately reflected upon a control signal 151 and the oscillation frequency can be corrected.

When the oscillation frequency is in a stationary state, the mean value of the oscillation frequency is kept a predetermined frequency by repeating a state in which a control signal 151 is at a high level and a state in which it is at a low level at approximately the same frequency, however, after a little time elapses since the supply voltage changes, the oscillation frequency can be controlled so that the mean value is a predetermined frequency by changing the frequency of a state in which a control signal 151 is at a high level and a state in which it is at a low level.

When time further elapses since the supply voltage changes, the voltage of a control signal 150 can be gradually varied based upon difference in the frequency between a high level and a low level of a control signal 151. When a control signal 150 changes and current which flows in the NMOS transistor 100 becomes voltage corresponding to a current value immediately before the supply voltage change, the supplement by the charge or the discharge of the capacitative element 120 is not required. Afterward, voltage applied to the oscillator 130 and the capacitative element 120 is finally restored to first voltage, repeating fluctuation such as a control signal 150 varies too much and the variation is reduced.

A capacitative element 122 is provided to gradually vary the voltage of a control signal 150 and to prevent the voltage of a control signal 150 from being suddenly varied by crosstalk and others.

If the capacitance of the capacitative element 120 is designed so that it is large enough, the variation of voltage applied to the oscillator 130 can be sufficiently retarded. Therefore, the maximum offset width in which the oscillation frequency is set off a predetermined frequency can be adjusted in a series of operation described above so that the maximum offset width is equal to or smaller than the width of fine adjustment by a control signal 151. In case the supply voltage changes again during the series of operation, the operation is newly started at that time.

Figure 2:
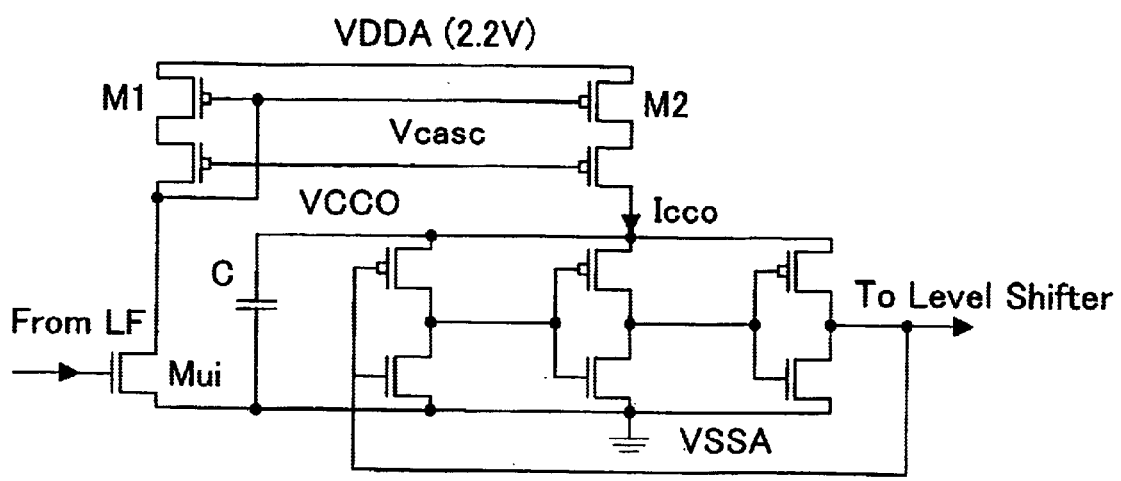
FIG. 2 is a circuit diagram showing one of conventional type voltage controlled oscillators.

In the conventional type example shown in FIG. 2, no mechanism equivalent to control by a control signal 151 according to the invention (that is, no mechanism that can be controlled at high speed without depending upon the capacitance of the capacitative element 120) is provided. Therefore, in case the change of the oscillation frequency was detected, the change had to be corrected by a mechanism equivalent to control by a control signal 150 according to the invention (that is, a mechanism that the response of control was delayed when the capacitance of the capacitative element 120 was increased). Therefore, to keep the stability of control, the capacitance of a capacitative element equivalent to the capacitative element 120 could not be increased.

In the invention, a mechanism that can control at high speed without depending upon the capacitance of the capacitative element 120 is provided, the capacitance of the capacitative element 120 can be increased enough. Therefore, in case the same supply voltage fluctuation is caused, the fluctuation of voltage applied to the oscillator can be reduced in the invention, compared with that in the conventional type example shown in FIG. 2 and jitter caused by the fluctuation can be reduced.

Figure 3:
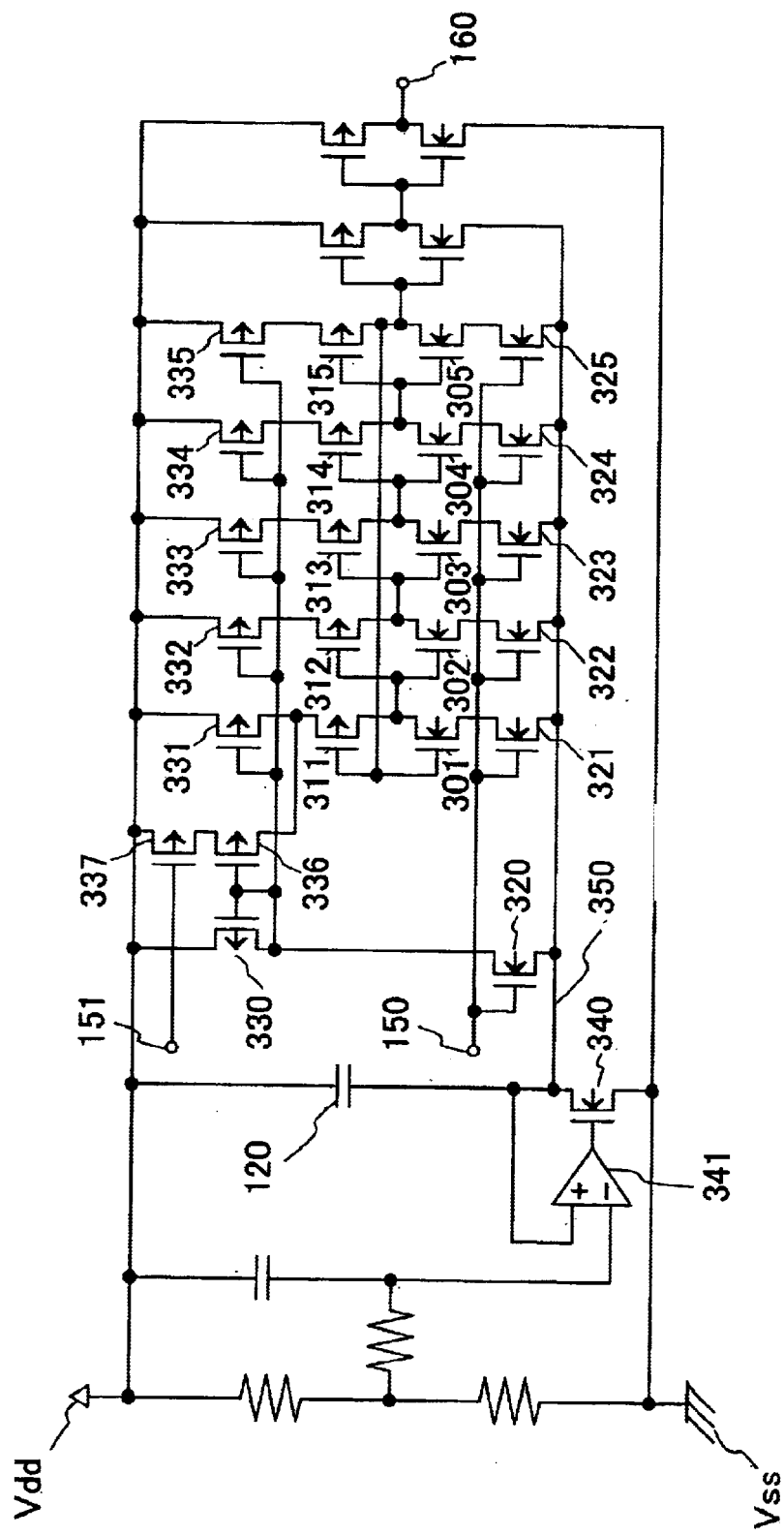
FIG. 3 is a circuit diagram showing one of the other conventional type voltage controlled oscillators.

Also, in the conventional type example shown in FIG. 3, as the NMOS transistor 340 used for a countermeasure for supply voltage fluctuation, the NMOS transistor 321 used for the rough adjustment of the oscillation frequency and others were arranged in series between the power sources, voltage applied to the NMOS transistor 340 was small and a range in which the NMOS transistor 340 was operated in a saturation state was small. Therefore, the allowable range of supply voltage fluctuation in which an effect to reduce jitter is acquired was small. In the invention, as only the common one NMOS transistor 100 is used for the countermeasure for supply voltage fluctuation and for the rough adjustment of the oscillation frequency, voltage applied to the NMOS transistor 100 can be increased, compared with that in the conventional type example shown in FIG. 3. Therefore, a range in which the NMOS transistor 100 is operated in a saturation state is larger than that in the conventional type example shown in FIG. 3 and the allowable range of supply voltage fluctuation in which the effect to reduce jitter is acquired is also large.

That is, according to the invention, an effect to reduce jitter larger than the sum of effects to reduce jitter which the conventional type examples shown in FIGS. 2 and 3 respectively have can be produced.

Figure 4:
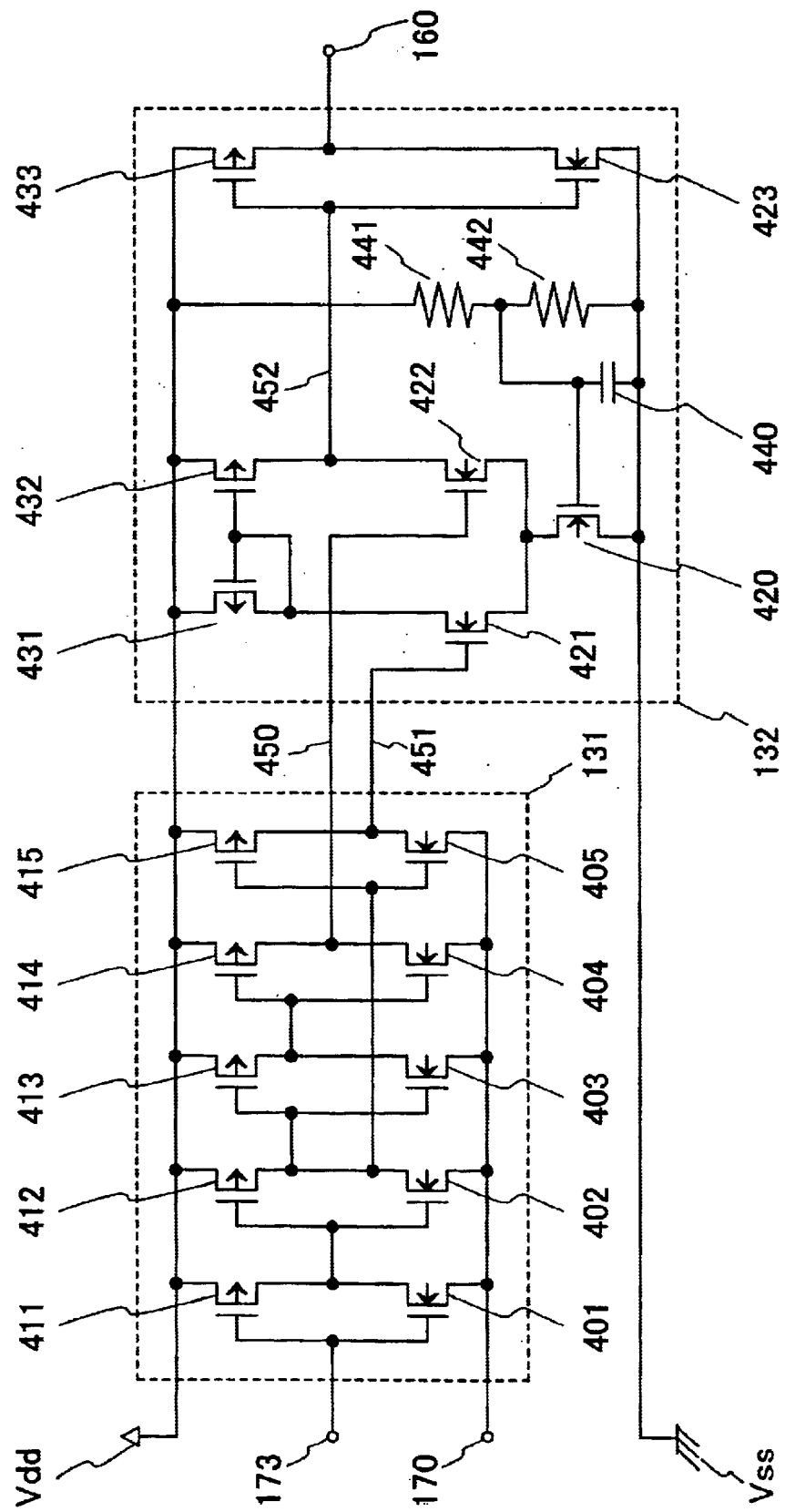
FIG. 4 is a circuit diagram showing a level shifter in the embodiment shown in FIG. 1.

FIG. 4 shows an embodiment of the concrete configuration of the buffer circuit 131 and the level shifter 132 which are components in the embodiment shown in FIG. 1. As shown in FIG. 4, reference numbers 401 to 405 and 420 to 423 denote an NMOS transistor, 411 to 415 and 431 to 433 denote a PMOS transistor, 440 denotes a capacitative element, and 441 and 442 denote a resistive element. Also, reference numbers 450 and 451 respectively denote a signal conductor and its node between a buffer circuit 131 and a level shifter 132, and 452 denotes an internal signal conductor and its node.

The buffer circuit 131 is a circuit to fetch a signal 173 from the oscillator 130 so that a large load is not applied to the oscillator 130. Also, the buffer circuit 131 in this embodiment is configured so that differential signals 450 and 451 are output from the buffer circuit. Concretely, the buffer circuit is configured by plural inverters composed of the NMOS transistors 401 to 405 and the PMOS transistors 411 to 415, and is configured so that a signal 173 is output to the signal conductor 450 via even-stages inverters and a signal 173 is output to the signal conductor 451 via odd-stage inverters. Also, the differential signals 450 and 451 are made differential signals phase difference between which is approximately 180 degrees (that is, differential signals the time of one rise of which and the time of the other rise of which are substantially coincident) by designing so that MOS transistors composing each-stage inverter has a suitable dimension.

The level shifter 132 is a circuit to convert differential signals 450 and 451 that oscillate between the voltage of a power source Vdd and the voltage of the internal node 170 to a signal 160 that oscillates in a full amplitude between the voltage of the power source Vdd and the voltage of a power source Vss. The circuit is configured by a current switch circuit composed of the NMOS transistors 420 to 422 and the PMOS transistors 431 and 432 and an inverter composed of the NMOS transistor 423 and the PMOS transistor 433. The amplitude of an internal signal 452 is extended by the current switch circuit, the central voltage is brought close to an intermediate point between the voltage of Vdd and the voltage of Vss and the amplitude of the internal signal is extended by the inverter so that it is a substantially full amplitude. The capacitative element 440 is provided to prevent voltage between the gate and the source of the NMOS transistor 420 when the supply voltage fluctuates from suddenly varying. The resistive elements 441 and 442 are a resistor circuit for a voltage divider for generating bias voltage applied to the gate electrode of the NMOS transistor 420.

Figure 5:
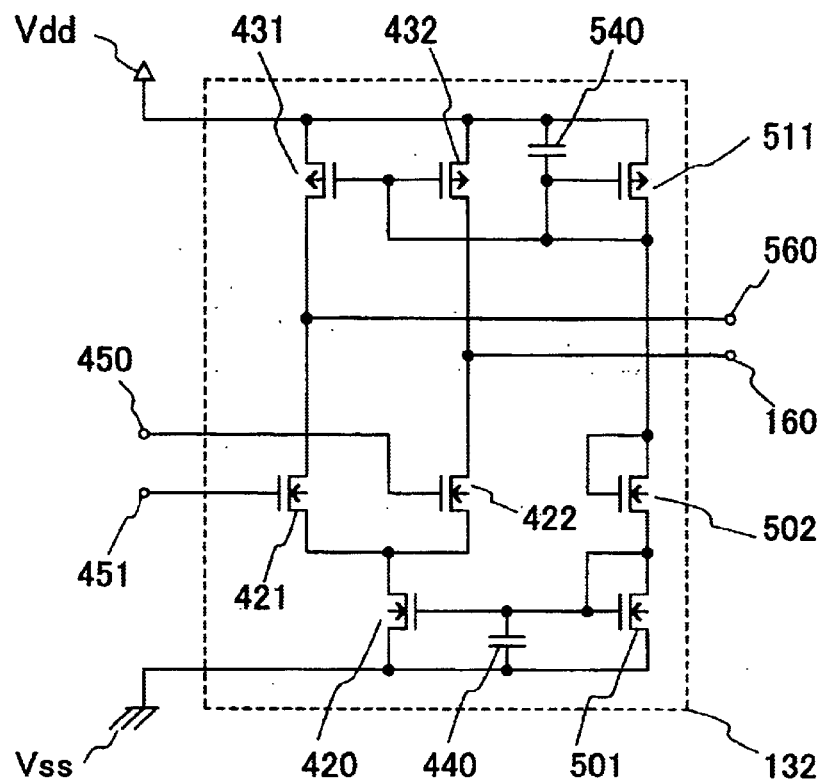
FIG. 5 is a circuit diagram showing one of transformed examples of the level shifter which can be used in the embodiment shown in FIG. 1.

FIG. 5 shows one of embodiments of the level shifter 132 except the embodiment described referring to FIG. 4. As shown in FIG. 5, reference numbers 501 and 502 denote an NMOS transistor, 511 denotes a PMOS transistor and 540 denotes a capacitative element. Also, a reference number 560 denotes one of output signals. The output signal 560 composes differential signals together with an output signal 160.

If such a level shifter 132 is used, the output of the voltage controlled oscillator in the embodiment shown in FIG. 1 can be also fetched using differential signals. Also, bias voltage applied to the gate electrode of the NMOS transistor 420 can be also generated using the resistor circuit for a voltage divider as shown in FIG. 4 and can be also generated using a circuit to divide voltage by the NMOS transistors 501 and 502 and the PMOS transistor 511 as shown in FIG. 5. If the circuit to divide voltage by the MOS transistors is used, it is easy to make output signals 160 and 560 oscillate in the vicinity of an intermediate point of the voltage of the power sources Vdd and Vss by designing so that the ratio of the gate width of the NMOS transistors 501 and 502 to that of the PMOS transistor 511 is equivalent to the ratio of a half of the gate width of the NMOS transistor 420 to the gate width of the NMOS transistors 421 and the PMOS transistor 431.

Also, the capacitative element 540 is provided to prevent voltage between the gate and the source of the PMOS transistors 431 and 432 from suddenly varying when the supply voltage fluctuates as the capacitative element 440.

Figure 6:
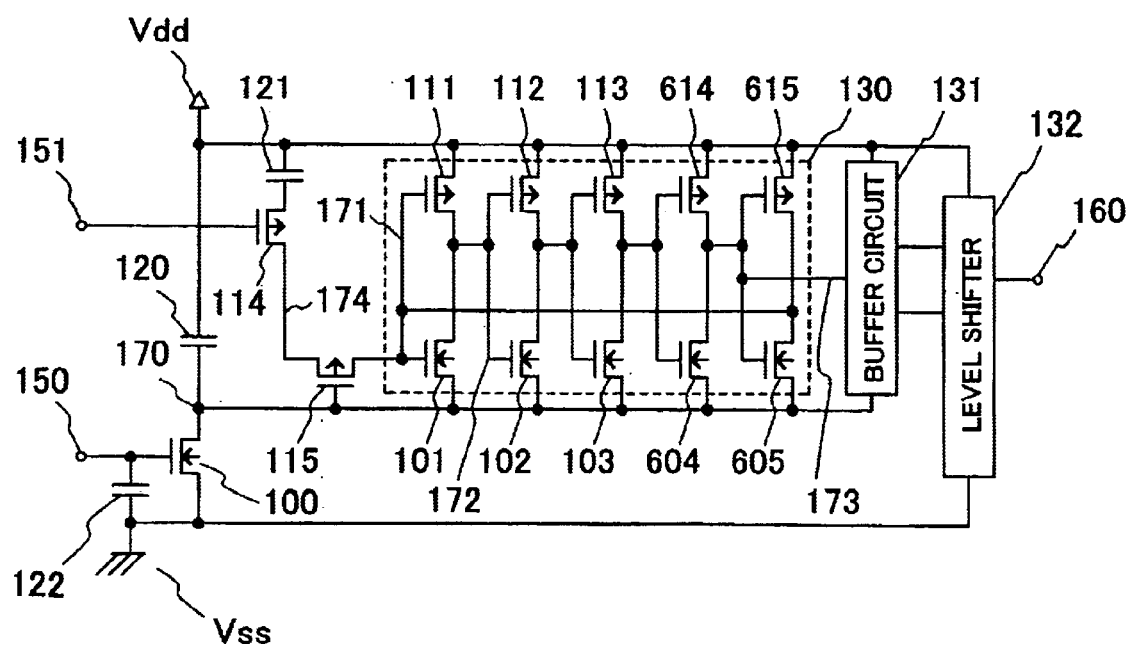
FIG. 6 is a circuit diagram showing one of another embodiments of the voltage controlled oscillator according to the invention.

FIG. 6 shows one of embodiments except the embodiment shown in FIG. 1 of the voltage controlled oscillator according to the invention. In FIG. 6, an example that NMOS transistors 604 and 605 and PMOS transistors 614 and 615 are added to the embodiment shown in FIG. 1 and the part of the oscillator 130 is configured by a ring oscillator composed of 5-stage inverters is shown. As described above, if only the number of stages of the inverters included in the ring oscillator is odd, the ring oscillator may also include any number of stages of inverters in principle.

When the number of stages of inverters is increased, the upper limit of frequency of oscillation is lowered, however, as the ratio of an oscillation cycle to delay time per one-stage inverter composing a buffer circuit 131 becomes large, it is facilitated to output differential signals the phase difference of which is approximately 180 degrees from the buffer circuit 131.

Figure 7:
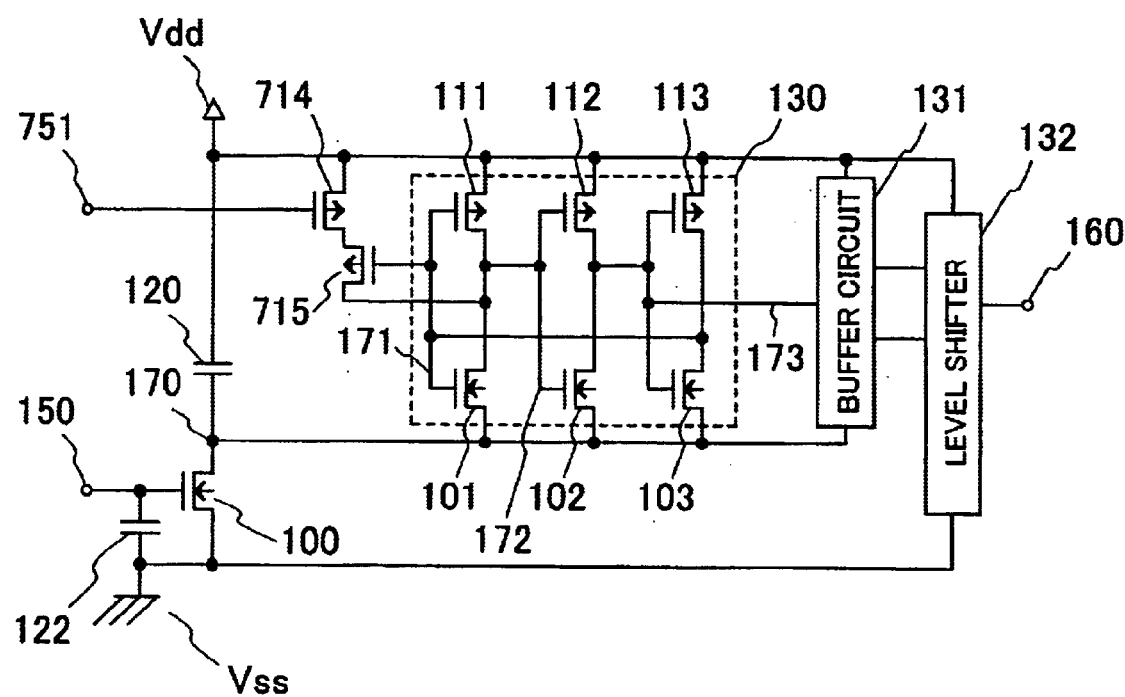
FIG. 7 is a circuit diagram showing one of further other embodiments of the voltage controlled oscillator according to the invention.

FIG. 7 shows one of further another embodiments of the voltage controlled oscillator according to the invention. FIG. 7 shows a circuit in which a part for controlling the oscillation frequency by a control signal 151 in the embodiment shown in FIG. 1 is varied. Concretely, PMOS transistors 714 and 715 are added so that current which flows in these PMOS transistors can reinforce current which flows in a PMOS transistor 111. It can be controlled by a control signal 751 whether current for reinforcement is made to flow or not, however, the control signal 751 is opposite to a control signal 151 in polarity. That is, when a control signal 751 is at a low level, the current described above is made to flow to increase the oscillation frequency and when it is at a high level, the oscillation frequency is reduced.

Figure 8:
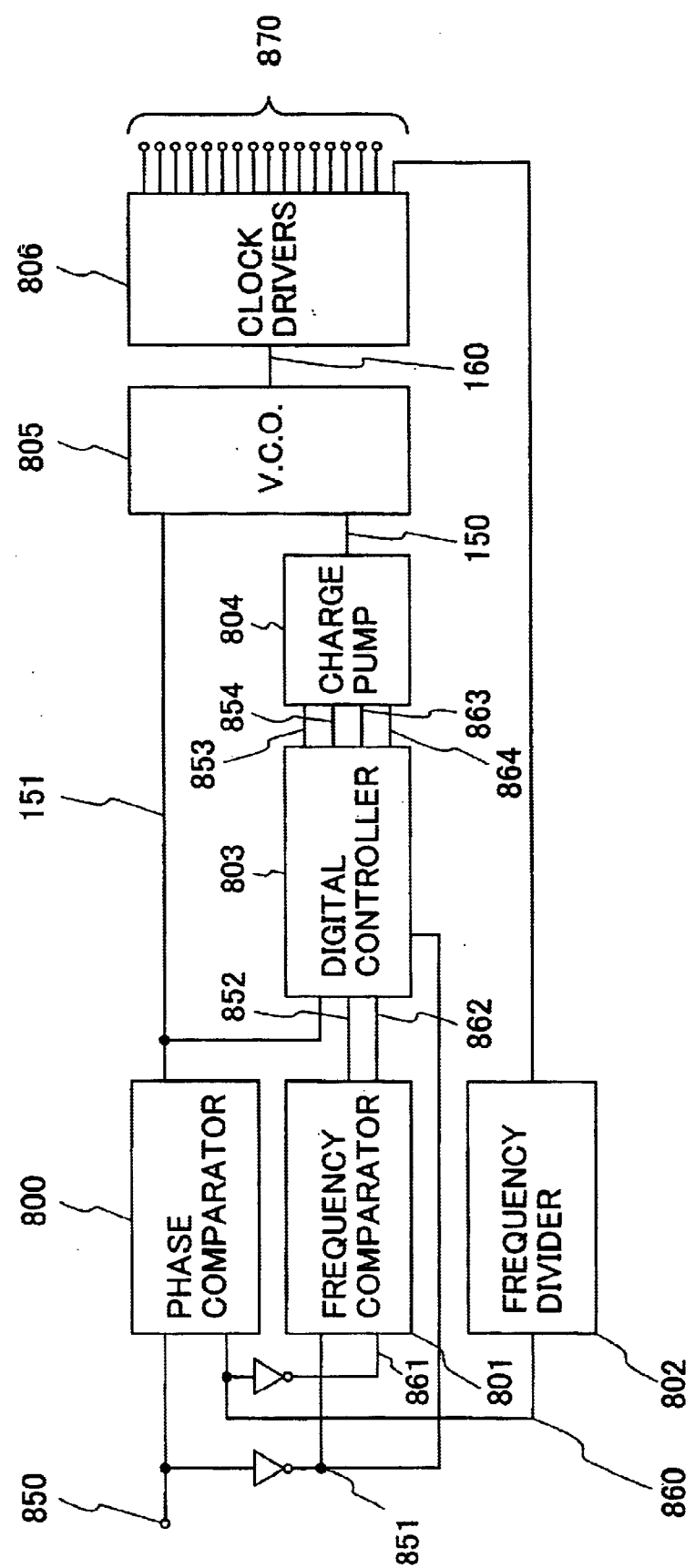
FIG. 8 is a circuit diagram showing one of embodiments of a PLL circuit according to the invention.

FIG. 8 shows one of embodiments of a PLL circuit composed using the voltage controlled oscillator according to the invention. As shown in FIG. 8, a reference number 800 denotes a phase comparator, 801 denotes a frequency comparator, 802 denotes a frequency divider, 803 denotes a digital controller, 804 denotes a charge pump, 805 denotes a voltage controlled oscillator according to the invention and 806 denotes clock drivers. Also, a reference number 870 denotes clock signals which is the output of the PLL circuit and their output terminals, 850 denotes a reference signal which functions as the reference of the phase of a clock signal and its input terminal, and 851 to 854 and 860 to 864 denote an internal signal conductor and its node.

The oscillation output 160 of the voltage controlled oscillator 805 is distributed to multiple destinations via the clock drivers 806 as a clock signal 870. One of them is input to the frequency divider 802 and is output as a signal 860. The phase and the frequency of a signal 860 and a reference signal 850 are compared by the phase comparator 800 and the frequency comparator 801, and the result is output as signals 151, 852 and 862. However, to prevent the phase of a signal input to the phase comparator 800 from being influenced by the dispersion of the load of the circuit and others, a signal 860 and a reference signal 850 are directly input to the phase comparator 800, and signals 861 and 851 via a buffer are input to the frequency comparator 801. Also, the frequency comparator 801 is configured so that when the frequency of a signal 851 is more than that of a signal 861, a signal 852 is turned at a high level and when the frequency of a signal 861 is more than that of a signal 851, a signal 862 is turned at a high level.

The result of the comparison is input to the digital controller 803. The digital controller 803 is a digital circuit synchronized with a reference signal 851 via the buffer and generates signals 853, 854, 863 and 864 for driving the charge pump 804 based upon the result of the comparison. The charge pump 804 is a circuit driven by these signals for supplying electric charge to the terminal 150 and deriving electric charge from the terminal 150.

As a result, the quantity of electric charge stored in the capacitative element 122 (see FIG. 1) connected to the input terminal 150 of the voltage controlled oscillator 805 is varied and the voltage of a control signal 150 is varied. The oscillation frequency of the voltage controlled oscillator 805 is controlled by the control signal 150 and a control signal 151 directly supplied from the phase comparator 800. The result is fed back to a signal 860 via the frequency divider 802, and the frequency and the phase of a signal 860 and a reference signal 850 are finally coincident.

Figure 9:
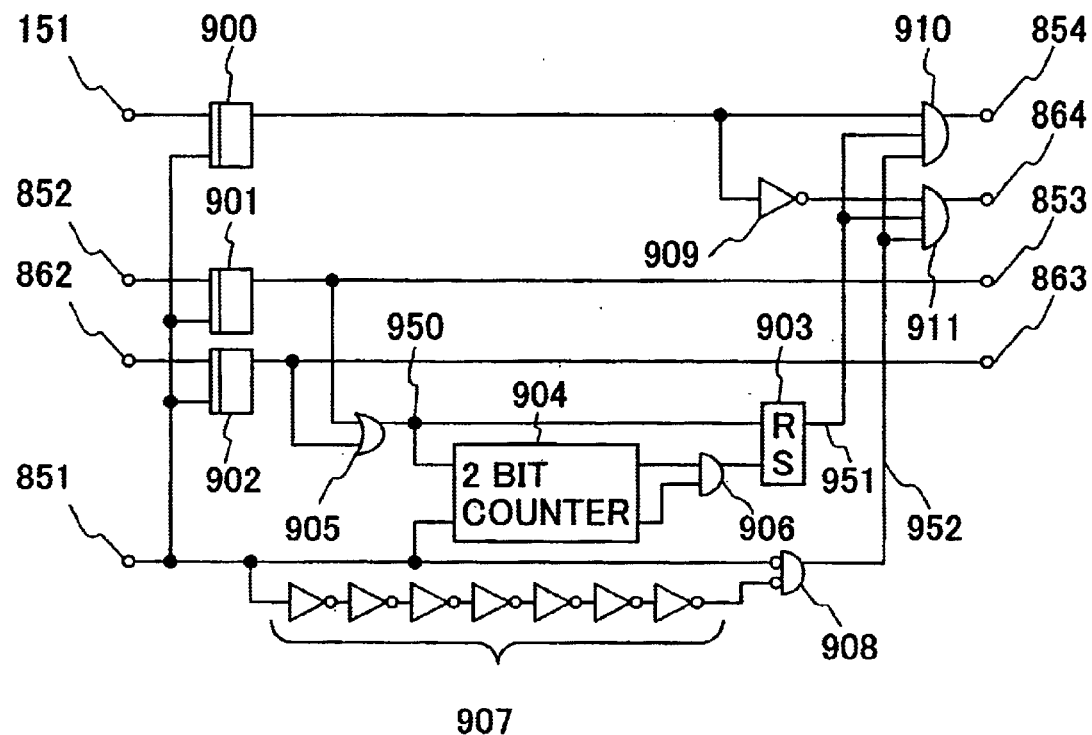
FIG. 9 is a circuit diagram showing a digital controller in the embodiment shown in FIG. 8.

FIG. 9 shows one of embodiments of the concrete configuration of the digital controller 803 which is a component in the embodiment shown in FIG. 8. As shown in FIG. 9, reference numbers 900 to 902 denote edge triggered type flip-flop, 903 denotes set-reset type flip-flop, 904 denotes a 2-bit counter, 905 denotes an OR circuit, 906, 910 and 911 denote an AND circuit, 907 denotes plural and odd inverters, 908 denotes a NOR circuit and 909 denotes an inverter. Also, reference numbers 950 to 952 denote an internal signal conductor and its node. Of these, the 2-bit counter 904 is configured so that it counts every time a pulse is applied to a reference signal 851 via a buffer and when a signal 950 is turned at a high level, it is reset.

Next, the operation of the circuit will be described. The flip-flops 900 to 902 are provided to read signals 151, 852 and 862 which are output of the comparators 800 and 801 in synchronization with a reference signal 851 via the buffer. When a signal 852 or 862 including the result of the comparison of frequencies is at a high level, the signal is output to the node 853 or 863 and an internal signal 950 is turned at a high level. Then, the flip-flop 903 is reset, an internal signal 951 is turned at a low level and a signal output to the node 854 or 864 is also turned at a low level. Also, at this time, the 2-bit counter 904 is also reset.

When signals 852 and 862 including the result of the comparison of frequencies are both turned at a low level, signals output to the node 853 and 863 are turned at a low level, an internal signal 950 is turned at a low level and every time a pulse is applied to a signal 851, the 2-bit counter 904 counts. Unless signals 852 and 862 are turned at a high level in counting four times, the flip-flop 903 is set and an internal signal 951 is turned at a high level. In the meantime, an internal signal 952 includes a pulse having pulse length determined by the total of the delay time of the inverter 907 every time a pulse is input to the node 851. Then, either signal at the node 854 or 864 determined by a signal 151 including the result of the comparison of phases is turned at a high level only during the pulse length of a pulse signal included in the internal signal 952.

The operation described above of the digital controller will be put in order as follows. When either of a signal 852 or 862 including the result of the comparison of frequencies is at a high level, a signal 853 or 863 is turned at a high level depending upon either and signals 854 and 864 are both turned at a low level. When a state that both signals 852 and 862 including the result of the comparison of frequencies are at a low level continues by 4 or more cycles, a pulse is output to either of the node 854 or 864 according to a signal 151 including the result of the comparison of phases.

A reason why the signals 853 and 863 output based upon the result of the comparison of frequencies and the signals 854 and 864 output based upon the result of the comparison of phases are separated is to quickly settle by applying large control when frequencies are not coincident and to prevent large jitter by reducing variation of control signal when frequencies are coincident and only phases are different. Therefore, separate signals are used.

Also, the signals 853 and 863 output based upon the result of the comparison of frequencies are kept at a high level during one cycle, while the signals 854 and 864 output based upon the result of the comparison of phases are turned a pulse. Hereby, time when control is applied can be also differentiated.

Also, a reason why the 2-bit counter 904 is provided is to avoid a situation that control is applied based upon the result of the comparison of phases immediately after the output of the result of the comparison of frequencies is finished. That is, immediately after the output of the result of the comparison of frequencies is finished, the correct comparison of phases cannot be often desired. Therefore, when control is applied based upon the result of the comparison of phases at that time, reverse control is often applied. Therefore, the 2-bit counter is provided to start control based upon the result of the comparison of phases in 4 cycles.

Figure 10:
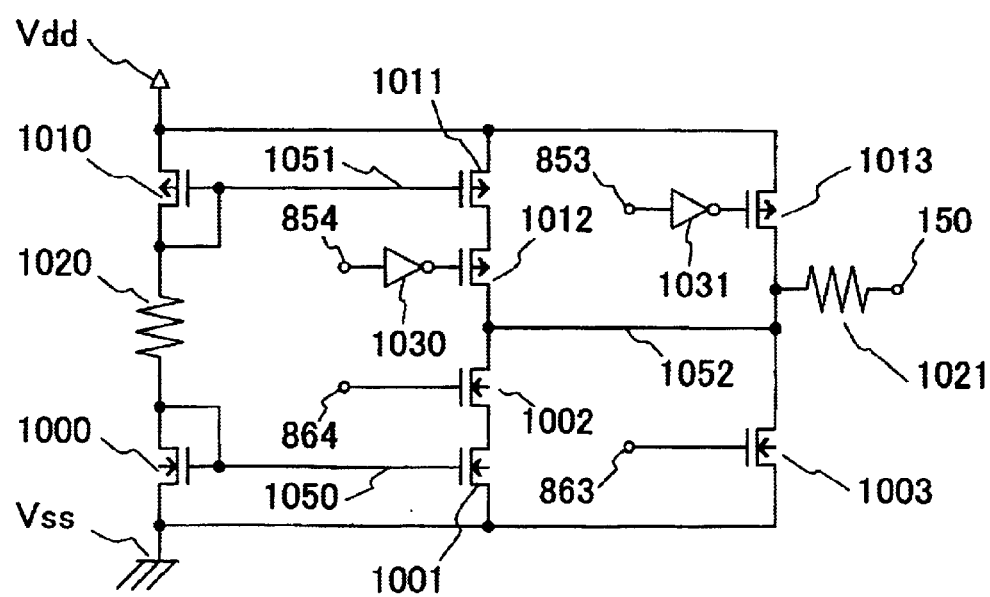
FIG. 10 is a circuit diagram showing a charge pump in the embodiment shown in FIG. 8.

FIG. 10 shows one of embodiments of the concrete configuration of the charge pump 804 which is a component in the embodiment shown in FIG. 8. As shown in FIG. 10, reference numbers 1000 to 1003 denote an NMOS transistor, 1010 to 1013 denote a PMOS transistor, 1020 and 1021 denote a resistive element, and 1030 and 1031 denote an inverter. Also, reference numbers 1050 to 1052 denote an internal signal conductor and its node.

In this circuit, when a signal at the node 853 is turned at a high level, the PMOS transistor 1013 conducts, current flows from Vdd to the node 1052, when a signal at the node 863 is turned at a high level, the NMOS transistor 1003 conducts and current flows from the node 1052 to Vss. As the node 1052 is connected to the terminal for a control signal 150 via the resistive element 1021, the current charges or discharges the capacitative element 122 in the voltage controlled oscillator shown in FIG. 1 and other drawings. The resistive element 1021 is provided to prevent the potential of the node 150 from being temporarily too high or too low because of parasitic resistance of the capacitative element 122.

When the signal 854 or 864 is turned at a high level, similar charge and discharge are also performed. However, as current which flows in the NMOS transistor 1002 and PMOS transistor 1012 is limited by the NMOS transistor 1001 and the PMOS transistor 1011, a current value can be reduced, compared with a case of charge and discharge by the signal 853 or 863. The current value at that time can be set rather freely depending upon the design of ratio in gate width between the NMOS transistors 1000 and 1001 and ratio in gate width between the PMOS transistors 1010 and 1011 and further, the resistance value of the resistive element 1020.

Also, the current value of charge and discharge by the signal 853 or 863 can be also set freely to some extent depending upon the gate width of the NMOS transistor 1003 and the PMOS transistor 1013.

At least, the fluctuation in one cycle by the output of the frequency comparator of the voltage of a control signal 150 should be set so that it is larger than the fluctuation in one cycle by the output of the phase comparator of the voltage of the control signal 150.

A circuit for charge and discharge by the signal 853 or 863 may be similarly realized to a circuit for charge and discharge by the signal 854 or 864 by limiting current in other MOS transistors and a current value can be also set depending upon its gate width and others.

Further, for a combination of the digital controller shown in FIG. 9 and the charge pump shown in FIG. 10, two control systems of a control system based upon the result of the comparison of frequencies (charge and discharge by the signal 853 or 863) and a control system based upon the result of the comparison of phases (charge and discharge by the signal 854 or 864) are provided, however, three or more control systems may be also provided to correspond to the degree of control in case difference between frequencies is large and in case it is small.

That is, in case frequencies are different by twice or more times, the output 852 or 862 of the frequency comparator is continuously at a high level, however, when the ratio of frequencies is below twice, the output 582 or 862 of the frequency comparator is never continuously at a high level. Further, when the ratio is below 1.5 times, the output 852 or 862 of the frequency comparator is turned at a high level only one per three or more cycles. The digital controller can easily detect this.

In the embodiment shown in FIG. 10, for a circuit for charge and discharge, only two systems are provided, however, three systems may be also provided so that a current value is differentiated every system, in case difference between frequencies is large, charge or discharge is performed by current having the largest current value, in case difference between frequencies is small, charge or discharge is performed by current having an intermediate degree of current value and when control is applied based upon the result of the comparison of phases, charge or discharge is performed by current having the smallest current value. Four or more systems can be naturally be provided.

Figure 11:
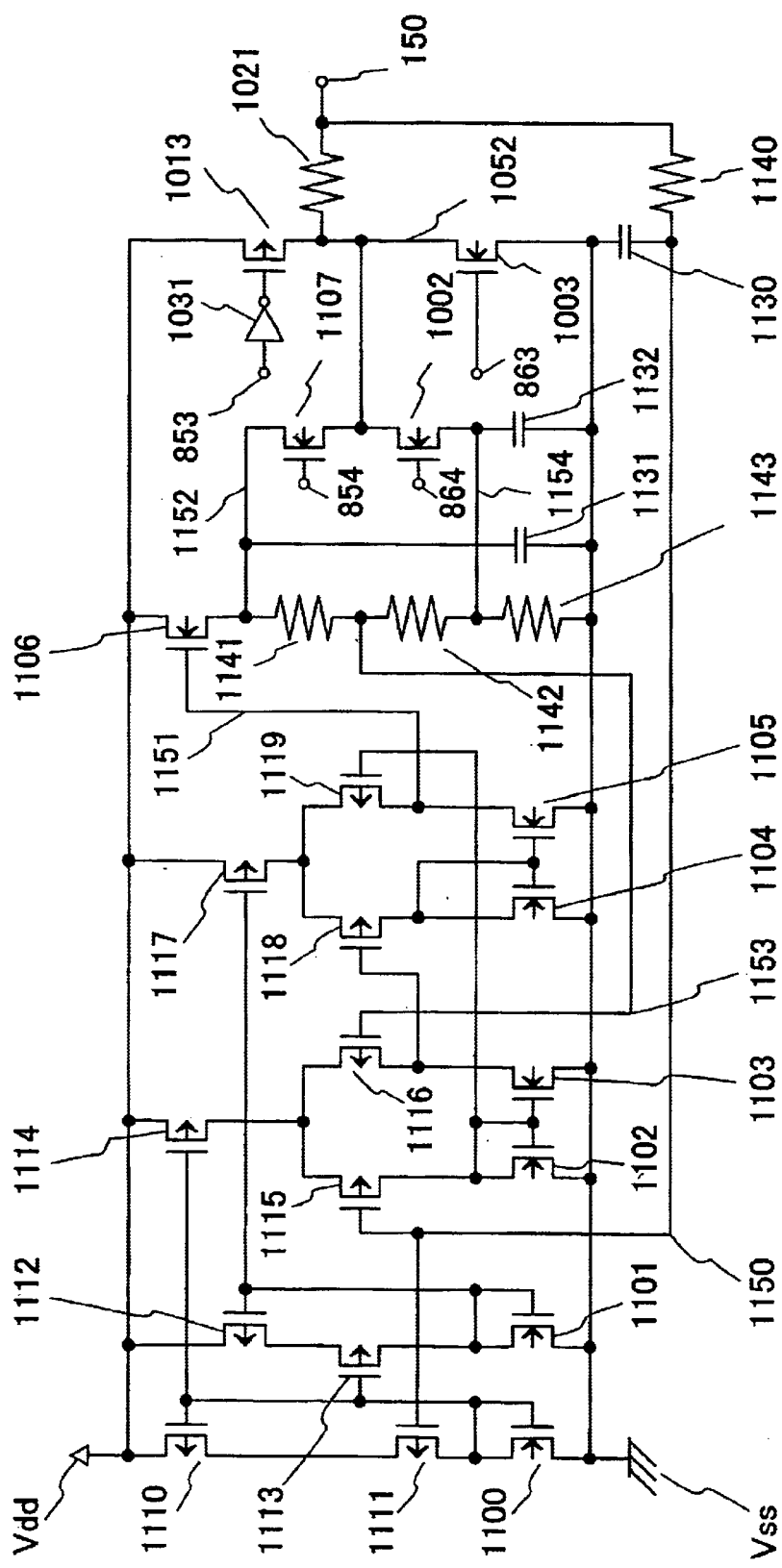
FIG. 11 is a circuit diagram showing one of transformed examples of the charge pump which can be used in the embodiment shown in FIG. 8.

FIG. 11 shows one of embodiments except the embodiment shown in FIG. 10 of the charge pump 804. As shown in FIG. 11, reference numbers 1100 to 1107 denote an NMOS transistor, 1110 to 1119 denote a PMOS transistor, 1130 to 1132 denote a capacitative element and 1140 to 1143 denote a resistive element. Also, reference numbers 1150 to 1154 denote an internal signal conductor and its node.

This circuit is a circuit acquired by improving the circuit shown in FIG. 10 to keep balance between the quantity of charge which is driven by the signal 854 and flows in and the quantity of charge which is driven by the signal 864 and flows out in case the voltage of a control signal 150 is close to the voltage of Vss. That is, in case the voltage of a control signal 150 is close to the voltage of Vss in the circuit shown in FIG. 10, sufficient voltage is applied between the source and the drain of the PMOS transistors 1011 and 1012, voltage applied between the source and the drain of the NMOS transistors 1001 and 1002 is not enough. Therefore, the quantity of charge which flows out by one driving signal is rather small, compared with the quantity of charge which flows in. The embodiment shown in FIG. 11 is improved in the point.

In the circuit shown in FIG. 11, voltage included in a control signal 150 is applied to the node 1150 via a low pass filter composed of the resistive element 1140 and the capacitative element 1130, and the voltage and voltage at the node 1153 are compared in a current switch composed of the PMOS transistors 1115, 1116 and others. The result is amplified in a current switch composed of the PMOS transistors 1118, 1119 and others and is sent to a source follower circuit composed of the NMOS transistor 1106.

Voltage output 1152 from the source follower circuit is divided in a resistor circuit for a voltage divider composed of the resistive elements 1141 to 1143 and is fed back to the node 1153. Then, when voltage at the node 1153 is equal to voltage at the node 1150, that is, voltage included in the control signal 150, they are balanced. In case the resistive elements 1141 and 1142 are designed so that the respective resistance values are equal, difference between voltage at the node 1152 and voltage included in the control signal 150 is substantially equal to difference between voltage included in the control signal 150 and voltage at the node 1154, and the quantity of charge which flows in when the NMOS transistor 1107 conducts and the quantity of charge which flows out when the NMOS transistor 1002 conducts can be substantially equal. As this circuit is useful only in case voltage included in the control signal 150 and voltage at the node 1052 are close to the voltage of Vss, an NMOS transistor is also used for the MOS transistor 1107 driven by the signal 854.

Figure 12:
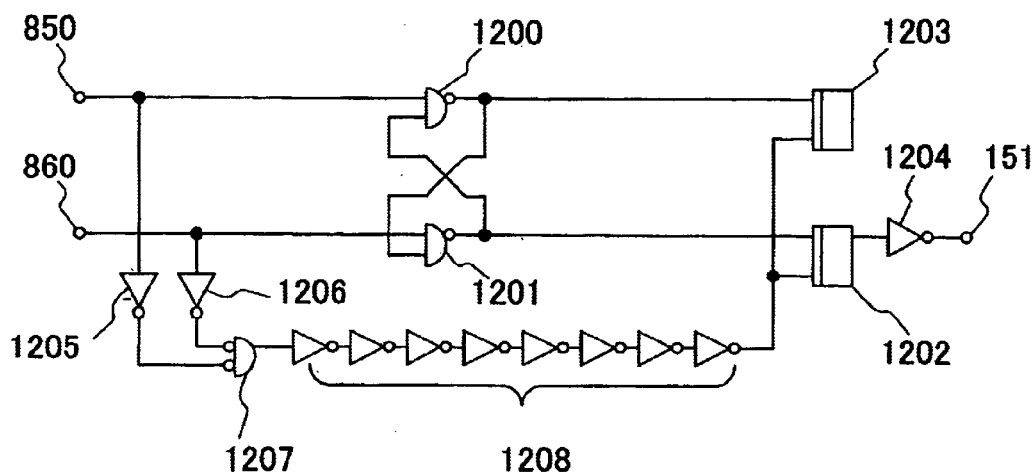
FIG. 12 is a circuit diagram showing a phase comparator in the embodiment shown in FIG. 8.

FIG. 12 shows one of embodiments of the concrete configuration of the phase comparator 800 which is a component in the embodiment shown in FIG. 8. This circuit is disclosed in Japanese published unexamined patent application No. Hei 9-74352. In this circuit, it is compared in flip-flop composed of NAND circuits 1200 and 1201 which of the rise of a signal 850 and the rise of a signal 860 previously occurs, flip-flop 1202 reads the result and outputs it to a terminal 151.

Figure 13:
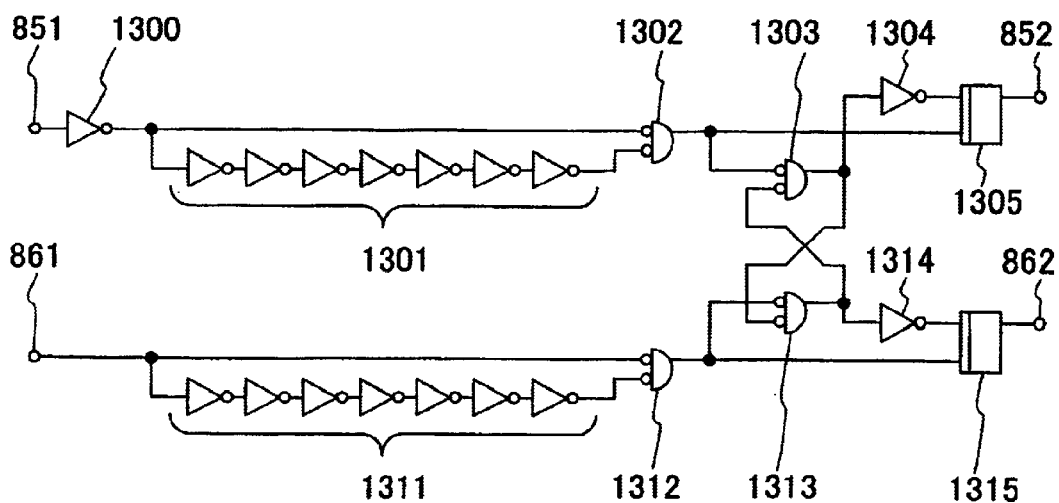
FIG. 13 is a circuit diagram showing a frequency comparator in the embodiment shown in FIG. 8.

FIG. 13 shows one of embodiments of the concrete configuration of the frequency comparator 801 which is a component in the embodiment shown in FIG. 8. This circuit is also disclosed in Japanese published unexamined patent application No. Hei 9-74352. In this circuit, it is compared whether the rise of the signal 851 and the fall of the signal 861 alternately occur or not and when either continuously occurs twice or more times, an out signal 852 or 862 on the continuous side is turned at a high level.

If the PLL circuit described above is used, the voltage controlled oscillator according to the invention wherein jitter caused when the supply voltage fluctuates is small can be efficiently used.

Figure 14:
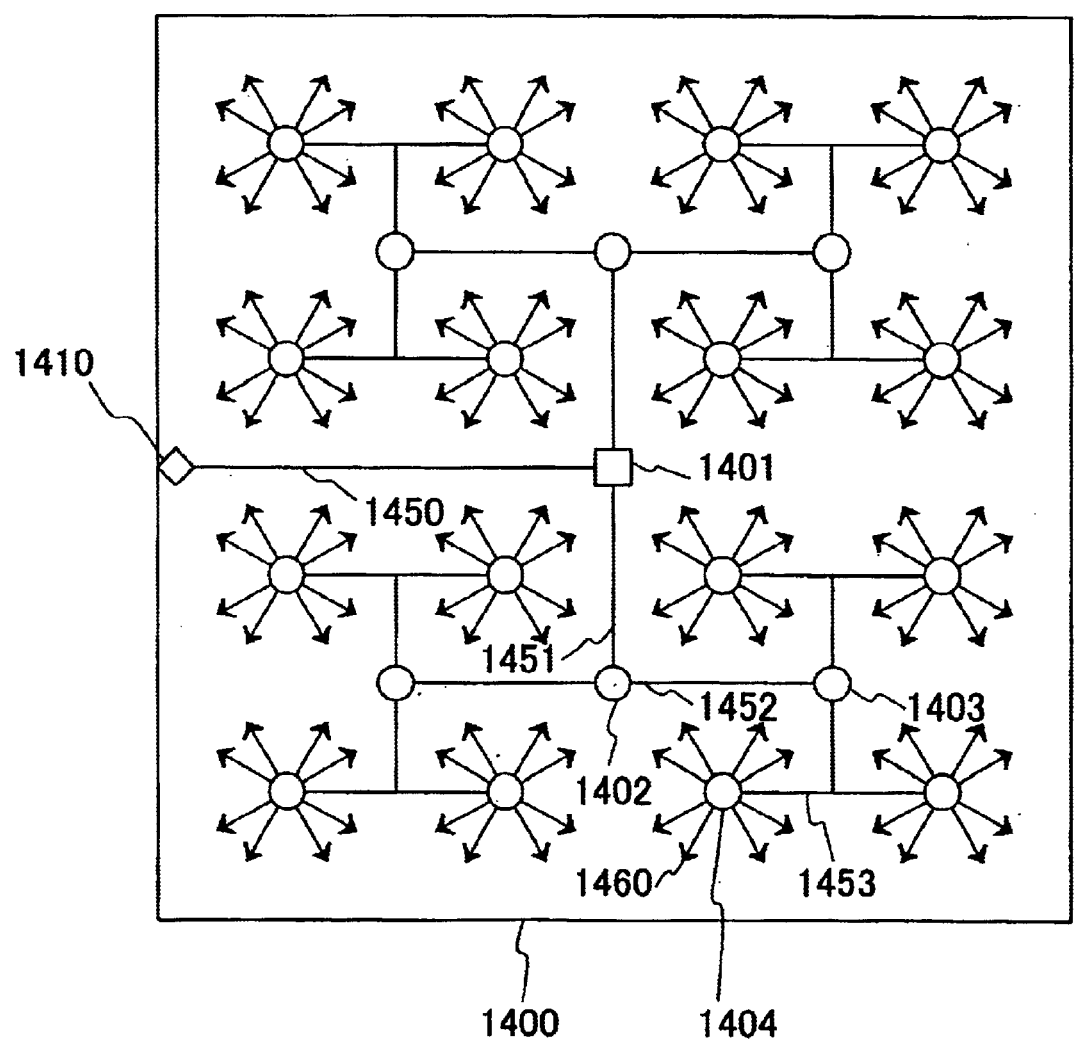
FIG. 14 is a layout drawing showing one of embodiments of a semiconductor integrated circuit according to the invention.

FIG. 14 is a layout drawing showing one of embodiments of a semiconductor integrated circuit configured using the PLL circuit according to the invention. As shown in FIG. 14, a reference number 1400 denotes the semiconductor integrated circuit, 1401 denotes a position where a main part of the PLL circuit including the voltage controlled oscillator according to the invention is mounted, 1402 to 1404 denote a position where a driver composing the clock drivers 806 is mounted in a dispersed state and 1410 denotes a position where an input circuit for receiving a reference signal supplied from an external device is mounted. Also, reference numbers 1450 to 1453 denote wiring for connecting these devices and 1460 denotes wiring for supplying a clock signal 870 to each destination.

According to the voltage controlled oscillator according to the invention, jitter caused when the supply voltage fluctuates can be reduced.

Also, according to the PLL circuit according to the invention, the PLL circuit wherein jitter caused when the supply voltage fluctuates is small can be realized.

Also, as jitter caused when the supply voltage fluctuates is small in case the voltage controlled oscillator according to the invention is used, the components of the PLL circuit including the voltage controlled oscillator can be mounted in an arbitrary position in the semiconductor integrated circuit without minding supply voltage fluctuation.

What is claimed is:

1. A voltage controlled oscillator circuit, comprising:
   a first node connected to a first power source having a first voltage;
   a second node connected to a second power source having a second voltage;
   a first MOS transistor;
   an oscillator arranged between the first node and a third node; and
   a first capacitive element arranged between the first node and the third node;
   a second capacitive element; and
   a node connected to the second capacitive element;
   wherein an oscillation frequency of the oscillator is controlled by connecting a source of the first MOS transistor to the second node, connecting a drain of the first MOS transistor to the third node, applying an analog control signal to a gate of the first MOS transistor, and changing a frequency of a high level and a low level of a digital control signal; and
   connection to and disconnection from the second capacitive element are selected according to the digital control signal.

2. A voltage controlled oscillator circuit according to claim 1, wherein the oscillator includes at least three inverters each formed by connecting a drain of a P-channel MOS transistor to a drain of an N-channel MOS transistor; and
   wherein the inverters are looped by sequentially connecting respective output terminals of the inverters to respective input terminals of the inverters.

3. A phase-locked loop (PLL) circuit, comprising:
   a voltage controlled oscillator circuit according to claim 2;
   a frequency divider;
   a phase comparator;
   a frequency comparator; and
   a control circuit;
   wherein the frequency divider outputs a divided output signal obtained by dividing a frequency of an output signal from the voltage controlled oscillator circuit;
   wherein the phase comparator receives a reference signal and the divided output signal, compares a phase of the reference signal with a phase of the divided output signal, and outputs a phase difference detection signal;
   wherein the frequency comparator receives the reference signal and the divided output signal, compares a frequency of the reference signal with a frequency of the divided output signal, and outputs a frequency difference detection signal;

wherein the control circuit receives the phase difference detection signal and the frequency difference detection signal and outputs the analog control signal to execute control according to the phase difference detection signal and the frequency difference detection signal; and wherein the phase difference detection signal corresponds to the digital control signal.

4. A phase-locked loop (PLL) circuit according to claim 3, wherein the control circuit also receives the reference signal;

wherein the control circuit executes control according to the phase difference detection signal and the frequency difference detection signal every cycle of the reference signal; and wherein a variation of a voltage of the analog control signal according to the frequency difference detection signal is larger than a variation of the voltage of the analog control signal according to the phase difference detection signal.

5. A phase-locked loop (PLL) circuit according to claim 3, wherein the control circuit has a control cycle in which the control circuit executes control according to the phase difference detection signal and the frequency difference detection signal every cycle of the reference signal; and wherein the frequency comparator includes
means for comparing the frequency of the reference signal with the frequency of the divided output signal, and
means for preventing a variation of a voltage of the analog control signal according to the phase difference detection signal in a first control cycle in which the frequency difference detection signal corresponding to a detection of a frequency difference is outputted and in a predetermined number of control cycles following the first control cycle.

6. A phase-locked loop (PLL) circuit, comprising:
a voltage controlled oscillator circuit according to claim 1;
a frequency divider;
a phase comparator;
a frequency comparator; and
a control circuit;
wherein the frequency divider outputs a divided output signal obtained by dividing a frequency of an output signal from the voltage controlled oscillator circuit;
wherein the phase comparator receives a reference signal and the divided output signal, compares a phase of the reference signal with a phase of the divided output signal, and outputs a phase difference detection signal;
wherein the frequency comparator receives the reference signal and the divided output signal, compares a frequency of the reference signal with a frequency of the divided output signal, and outputs a frequency difference detection signal;
wherein the control circuit receives the phase difference detection signal and the frequency difference detection signal and outputs the analog control signal to execute control according to the phase difference detection signal and the frequency difference detection signal; and
wherein the phase difference detection signal corresponds to the digital control signal.

7. A phase-locked loop (PLL) circuit according to claim 6, wherein the control circuit also receives the reference signal;

wherein the control circuit executes control according to the phase difference detection signal and the frequency difference detection signal every cycle corresponding to one cycle of the reference signal; and wherein a variation of a voltage of the analog control signal according to the frequency difference detection signal is larger than a variation of the voltage of the analog control signal according to the phase difference detection signal.

8. A phase-locked loop (PLL) circuit according to claim 6, wherein the control circuit has a control cycle in which the control circuit executes control according to the phase difference detection signal and the frequency difference detection signal every cycle of the reference signal; and wherein the frequency comparator includes
means for comparing the frequency of the reference signal with the frequency of the divided output signal, and
means for preventing a variation of a voltage of the analog control signal according to the phase difference detection signal in a first control cycle in which the frequency difference detection signal corresponding to a detection of a frequency difference is outputted and in a predetermined number of control cycles following the first control cycle.

9. A voltage controlled oscillator circuit, comprising:
a first node connected to a first power source having a first voltage;
a second node connected to a second power source having a second voltage;
a first MOS transistor;
an oscillator arranged between the first node and a third node; and
a first capacitive element arranged between the first node and the third node;
a second capacitive element; and
a second MOS transistor;
wherein an oscillation frequency of the oscillator is controlled by connecting a source of the first MOS transistor to the second node, connecting a drain of the first MOS transistor to the third node, applying an analog control signal to a gate of the first MOS transistor, and changing a frequency of a high level and a low level of a digital control signal;
the second MOS transistor is used for a switch to the second capacitive element; and
connection to and disconnection from the second capacitive element are selected by inputting the digital control signal to a gate of the second MOS transistor.

10. A voltage controlled oscillator according to claim 9, wherein the oscillator includes at least three inverters each formed by connecting a drain of a P-channel MOS transistor to a drain of an N-channel MOS transistor; and wherein the inverters are looped by sequentially connecting respective output terminals of the inverters to respective input terminals of the inverters.

11. A phase-locked loop (PLL) circuit, comprising:
a voltage controlled oscillator circuit according to claim 10;
a frequency divider;
a phase comparator;

a frequency comparator; and a control circuit;

wherein the frequency divider outputs a divided output signal obtained by dividing a frequency of an output signal from the voltage controlled oscillator circuit;

wherein the phase comparator receives a reference signal and the divided output signal, compares a phase of the reference signal with a phase of the divided output signal, and outputs a phase difference detection signal;

wherein the frequency comparator receives the reference signal and the divided output signal, compares a frequency of the reference signal with a frequency of the divided output signal, and outputs a frequency difference detection signal;

wherein the control circuit receives the phase difference detection signal and the frequency difference detection signal and outputs the analog control signal to execute control according to the phase difference detection signal and the frequency difference detection signal; and wherein the phase difference detection signal corresponds to the digital control signal.

12. A phase-locked loop (PLL) circuit according to claim 11, wherein the control circuit also receives the reference signal;

wherein the control circuit executes control according to the phase difference detection signal and the frequency difference detection signal every cycle of the reference signal; and wherein a variation of a voltage of the analog control signal according to the frequency difference detection signal is larger than a variation of the voltage of the analog control signal according to the phase difference detection signal.

13. A phase-locked loop (PLL) circuit according to claim 11, wherein the control circuit has a control cycle in which the control circuit executes control according to the phase difference detection signal and the frequency difference detection signal every cycle of the reference signal; and wherein the frequency comparator includes
means for comparing the frequency of the reference signal with frequency of the divided output signal, and
means for preventing a variation of a voltage of the analog control signal according to the phase difference detection signal in a first control cycle in which the frequency difference detection signal corresponding to a detection of a frequency difference is outputted and in a predetermined number of control cycles following the first control cycle.

14. A phase-locked loop (PLL) circuit, comprising:

a voltage controlled oscillator circuit according to claim 9;

a frequency divider;

a phase comparator;

a frequency comparator; and a control circuit;

wherein the frequency divider outputs a divided output signal obtained by dividing a frequency of an output signal from the voltage controlled oscillator circuit;

wherein the phase comparator receives a reference signal and the divided output signal, compares a phase of the reference signal with a phase of the divided output signal, and outputs a phase difference detection signal;

wherein the frequency comparator receives the reference signal and the divided output signal, compares a frequency of the reference signal with a frequency of the divided output signal, and outputs a frequency difference detection signal;

wherein the control circuit receives the phase difference detection signal and the frequency difference detection signal and outputs the analog control signal to execute control according to the phase difference detection signal and the frequency difference detection signal; and wherein the phase difference detection signal corresponds to the digital control signal.

15. A phase-locked loop (PLL) circuit according to claim 14, wherein the control circuit also receives the reference signal;

wherein the control circuit executes control according to the phase difference detection signal and the frequency difference detection signal every cycle corresponding to one cycle of the reference signal; and wherein a variation of a voltage of the analog control signal according to the frequency difference detection signal is larger than a variation of the voltage of the analog control signal according to the phase difference detection signal.

16. A phase-locked loop (PLL) circuit according to claim 14, wherein the control circuit has a control cycle in which the control circuit executes control according to the phase difference detection signal and the frequency difference detection signal every cycle of the reference signal; and wherein the frequency comparator includes
means for comparing the frequency of the reference signal with the frequency of the divided output signal, and
means for preventing a variation of a voltage of the analog control signal according to the phase difference detection signal in a first control cycle in which the frequency difference detection signal corresponding to a detection of a frequency difference is outputted and in a predetermined number of control cycles following the first control cycle.

* * * * *